(12) United States Patent
Park et al.

(10) Patent No.: US 9,648,746 B2
(45) Date of Patent: May 9, 2017

(54) COMPOSITE ELECTRONIC COMPONENT AND BOARD HAVING THE SAME

(71) Applicant: SAMSUNG ELECTRO-MECHANICS CO., LTD., Suwon-Si, Gyeonggi-Do (KR)

(72) Inventors: Heung Kil Park, Suwon-Si (KR); Sang Soo Park, Suwon-Si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 15 days.

(21) Appl. No.: 14/663,445

(22) Filed: Mar. 19, 2015

(65) Prior Publication Data

US 2016/0088735 A1   Mar. 24, 2016

(30) Foreign Application Priority Data

Sep. 23, 2014   (KR) .................. 10-2014-0127166

(51) Int. Cl.
| | |
|---|---|
| *H05K 7/00* | (2006.01) |
| *H05K 1/18* | (2006.01) |
| *H05K 3/34* | (2006.01) |
| *H05K 1/02* | (2006.01) |

(52) U.S. Cl.
CPC ........... *H05K 1/181* (2013.01); *H05K 3/3442* (2013.01); *H05K 1/0233* (2013.01); *H05K 2201/1003* (2013.01); *H05K 2201/10015* (2013.01); *H05K 2201/1053* (2013.01); *H05K 2201/10515* (2013.01); *Y02P 70/611* (2015.11); *Y02P 70/613* (2015.11)

(58) Field of Classification Search
USPC .................................. 361/782, 749
See application file for complete search history.

(56) References Cited

U.S. PATENT DOCUMENTS

| | | | |
|---|---|---|---|
| 6,080,468 A | 6/2000 | Yamaguchi | |
| 2004/0066589 A1* | 4/2004 | Togashi | H01G 2/065 361/15 |
| 2011/0188214 A1* | 8/2011 | Mishiro | H05K 3/361 361/749 |

FOREIGN PATENT DOCUMENTS

| | | |
|---|---|---|
| JP | 2005-317748 A | 11/2005 |
| KR | 10-0295588 B1 | 11/2001 |

* cited by examiner

*Primary Examiner* — Andargie M Aychillhum
(74) *Attorney, Agent, or Firm* — McDermott Will & Emery LLP

(57) ABSTRACT

There is provided a composite electronic component and a board having the same, and the composite electronic component may include: an interposer board, and first and second electronic components mounted on upper and lower surfaces of the interposer board, respectively, and first and second electronic components are electrically connected to each other by an electrical connection part provided on the interposer board.

20 Claims, 13 Drawing Sheets

COMPOSITE ELECTRONIC COMPONENT AND BOARD HAVING THE SAME

CROSS-REFERENCE TO RELATED APPLICATION

This application claims the priority and benefit of Korean Patent Application No. 10-2014-0127166 filed on Sep. 23, 2014, with the Korean Intellectual Property Office, the disclosure of which is incorporated herein by reference.

BACKGROUND

The present disclosure relates to a composite electronic component and a board having the same.

In accordance with the recent trend for the miniaturization and thinning of mobile devices such as a smartphones, and the like, a circuit board has been miniaturized, such that electronic components need to be mounted with a high degree of density.

Particularly, the number of general-purpose passive components required in mobile devices is increased, such that a relatively wide mounting area is required.

Further, in the case of a multilayer ceramic electronic component used as a low pass (LC) filter, or the like, physical deformation may be generated depending on a change in a voltage applied to such an electronic component, and this physical deformation may be transferred to a board having the multilayer ceramic electronic component, such that the board having the multilayer ceramic electronic component may vibrate.

When the board having the multilayer ceramic electronic component vibrates, noise audible to the human ear may be generated.

Therefore, a composite electronic component capable of decreasing a mounting area and vibrations of a board having the same has been required.

RELATED ART DOCUMENT (Patent Document 1) Japanese Patent Laid-Open Publication No. 2005-317748
(Patent Document 2) Korean Patent No. 10-0295588

SUMMARY

An aspect of the present disclosure may provide a composite electronic component having a decreased mounting area and reduced vibrations of a board having the composite electronic component.

Another aspect of the present disclosure may provide a composite electronic component in which a loss due to a wiring depending on an interval between electronic components configuring the composite electronic component may be significantly decreased.

According to an aspect of the present disclosure, a composite electronic component may include: an interposer board; and first and second electronic components mounted on upper and lower surfaces of the interposer board, respectively, wherein the first and second electronic components are electrically connected to each other by an electrical connection part provided on the interposer board.

According to another aspect of the present disclosure, a board having a composite electronic component may include: a circuit board on which land patterns are formed; and the composite electronic component mounted on the land patterns, wherein the composite electronic component includes: an interposer board; and first and second electronic components mounted on upper and lower surfaces of the interposer board, respectively, the first and second electronic components being electrically connected to each other by an electrical connection part provided on the interposer board.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
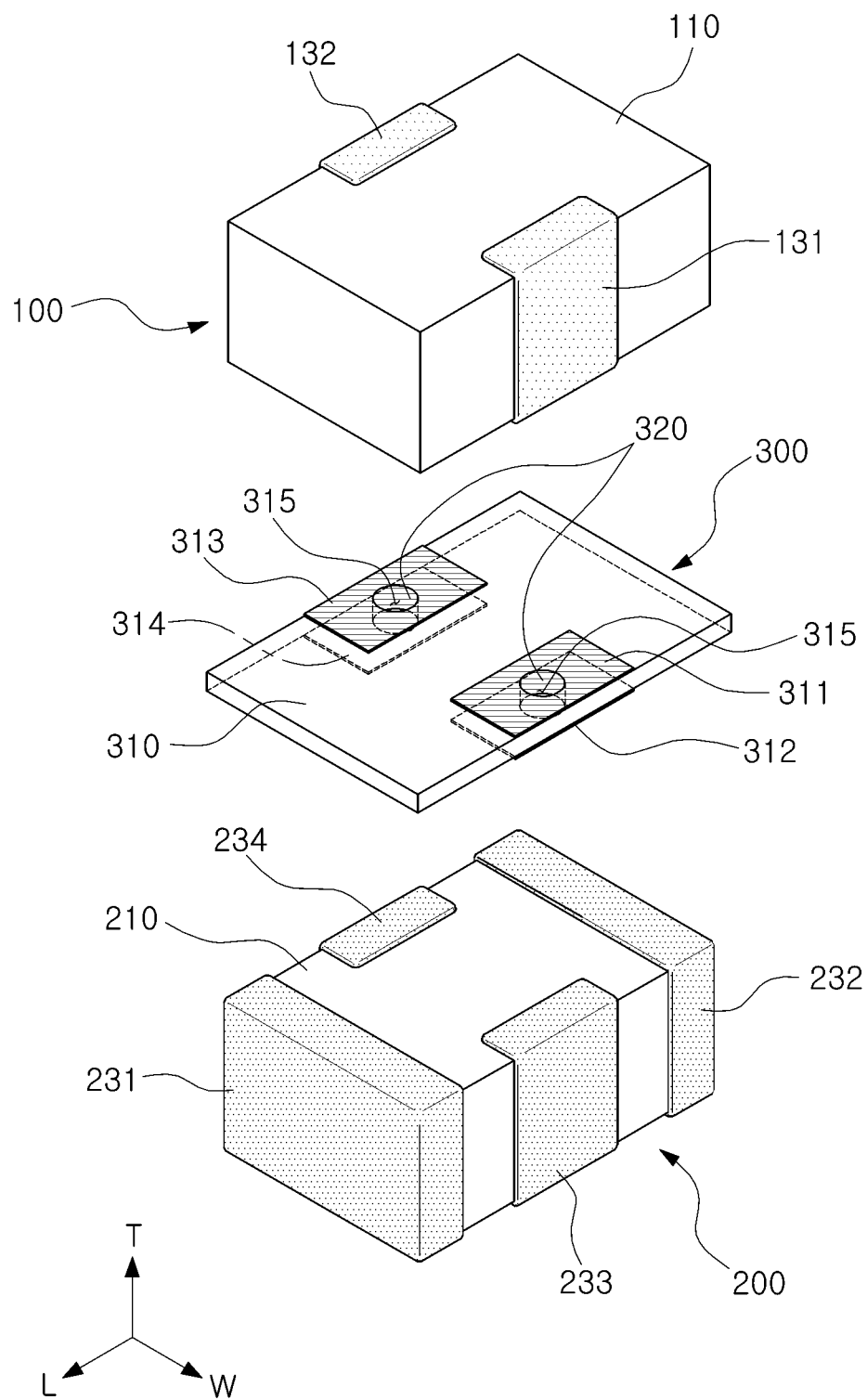
FIG. 1 is a schematic exploded perspective diagram of a composite electronic component according to an exemplary embodiment of the present disclosure.

Exemplary embodiments of the present disclosure will now be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Directions of a hexahedron will be defined in order to clearly describe exemplary embodiments of the present disclosure. L, W and T illustrated in the accompanying drawings refer to a length direction, a width direction, and a thickness direction, respectively.

Figure 2:
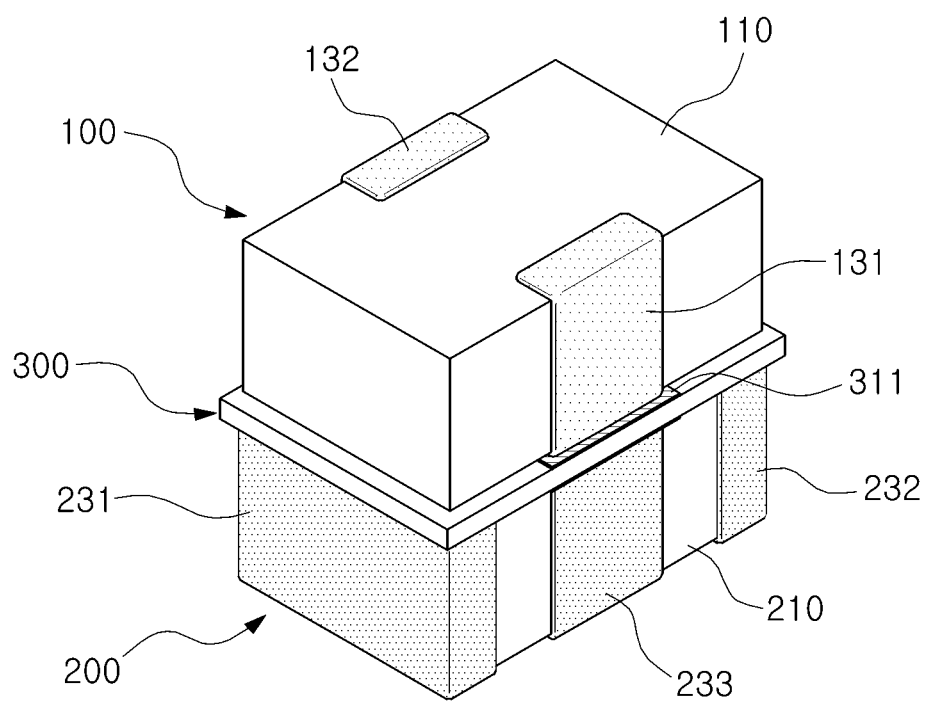
FIG. 2 is a schematic perspective diagram of the composite electronic component according to an exemplary embodiment of the present disclosure.
Figure 2:
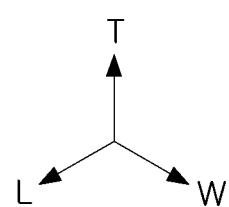
Figure 3:
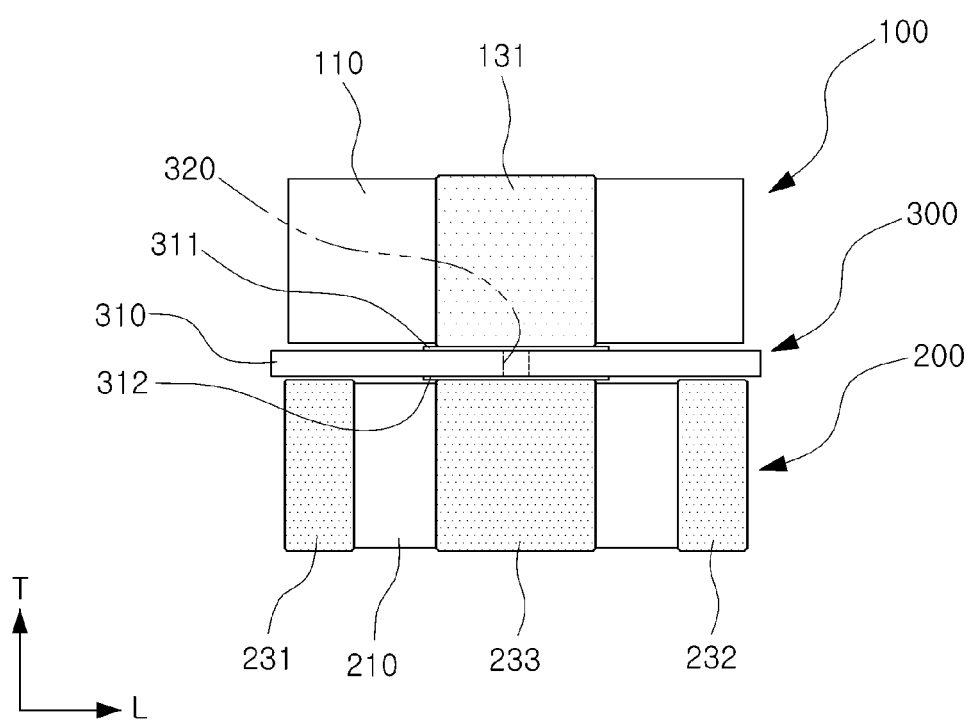
FIG. 3 is a schematic cross-sectional diagram of the composite electronic component according to an exemplary embodiment of the present disclosure.

FIGS. 1 and 2 are a schematic exploded perspective diagram and a perspective diagram of a composite electronic component according to an exemplary embodiment of the present disclosure, respectively, and FIG. 3 is a schematic cross-sectional diagram of the composite electronic component.

A structure of the composite electronic component according to an exemplary embodiment of the present disclosure will be described with reference to FIGS. 1 through 3.

The composite electronic component according to an exemplary embodiment of the present disclosure may include a first electronic component 100, a second electronic component 200, and an interposer board 300.

The first and second electronic components 100 and 200 may be inductors or capacitors.

In the first electronic component 100, first and second external electrodes 131 and 132 may be disposed on side surfaces of a body 110 in the width (W) direction.

The first and second external electrodes 131 and 132 of the first electronic component 100 may be extended from both side surfaces in the width direction onto portions of a lower surface thereof, respectively.

At least one external electrode may be formed on the first electronic component 100, and as needed, several external electrodes may be formed thereon.

In the case in which the first electronic component 100 is a capacitor, the first and second external electrodes 131 and 132 may be electrically connected to stacked internal electrodes, such that the internal electrodes may alternately have positive and negative polarities.

In the second electronic component 200, third and fourth external electrodes 233 and 234 may be disposed on both side surfaces of a body 210 in the width (W) direction, and fifth and sixth external electrodes 231 and 232 may be disposed on both end surfaces thereof in the length (L) direction.

The third and fourth external electrodes 233 and 234 of the second electronic component 200 may be extended from both side surfaces of the body 210 in the width (W) direction onto portions of an upper surface of the body, respectively.

In the case in which the second electronic component 200 is an inductor, the fifth and sixth external electrodes 231 and 232 may be electrically connected to coil shaped internal electrodes in the body 210.

The interposer board 300 may be positioned between the first and second electronic components 100 and 200.

That is, the first electronic component 100 may be mounted on an upper surface of the interposer board 200, and the second electronic component 200 may be mounted on a lower surface of the interposer board 300.

An electrical connection part may be formed on the interposer board 300.

The electrical connection part may include a pair of first terminal electrodes 311 and 312 and a pair of second terminal electrodes 313 and 314 that are disposed on the upper and lower surfaces of the interposer board 300 to face each other.

First and second via electrodes 320 may be formed in the interposer board 300 in the thickness direction so that the first via electrode 320 connects the first terminal electrodes 311 and 312 to each other and the second via electrode 320 connects the second terminal electrodes 313 and 314 to each other.

The first and second via electrodes 320 may be formed by forming via holes 315 and filling a conductive material in the via holes 315.

The first and second terminal electrodes 311 to 314 may be disposed to be adjacent to both side surfaces of the interposer board in the width (W) direction, respectively.

The first and second terminal electrodes 311 and 313 on the upper surface may be connected to the first and second external electrodes 131 and 132, respectively, and the first and second terminal electrodes 312 and 314 on the lower surface may be connected to the third and fourth external electrodes 233 and 234, respectively.

The first and second terminal electrodes 311 to 314 may be adhered to the first to fourth external electrodes 131, 132, 233, and 234 by a conductive adhesive.

Figure 4:
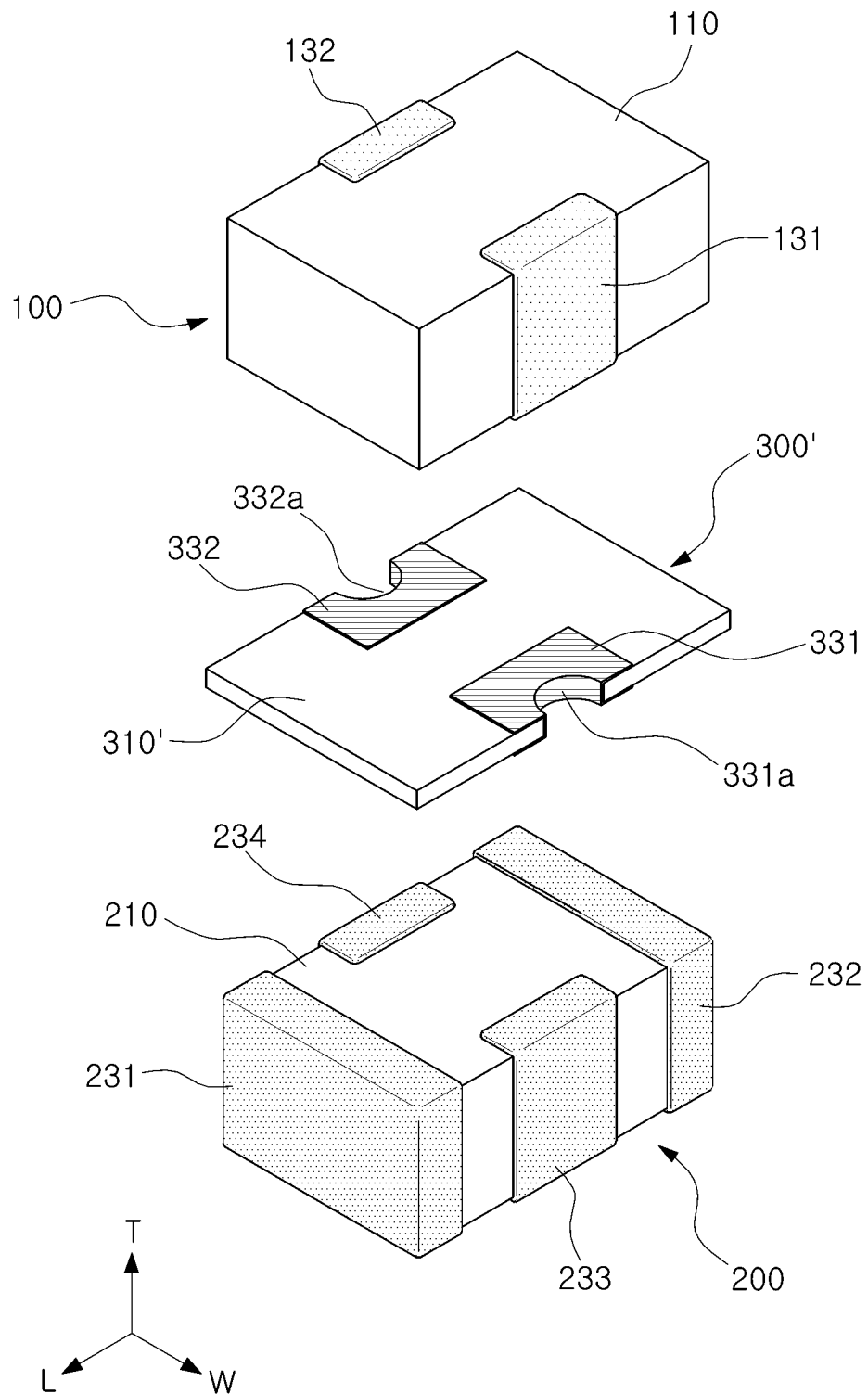
FIG. 4 is a schematic exploded perspective diagram of a composite electronic component according to another exemplary embodiment of the present disclosure.
Figure 5:
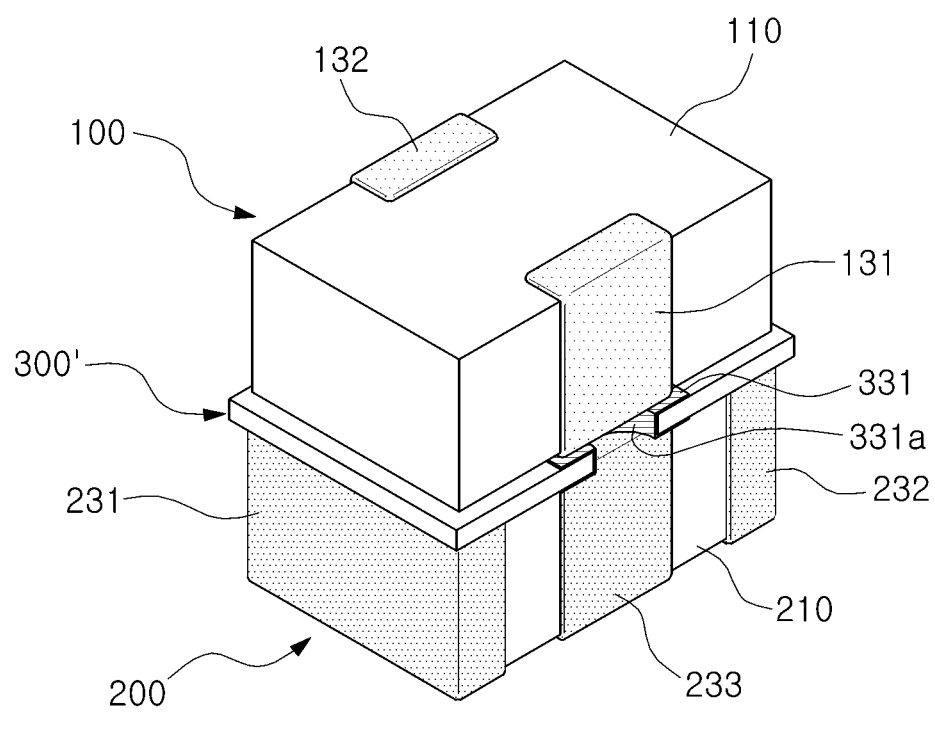
FIG. 5 is a schematic perspective diagram of the composite electronic component according to another exemplary embodiment of the present disclosure.
Figure 5:
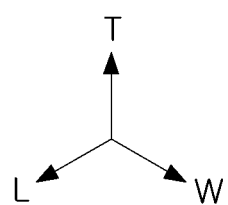
Figure 6:
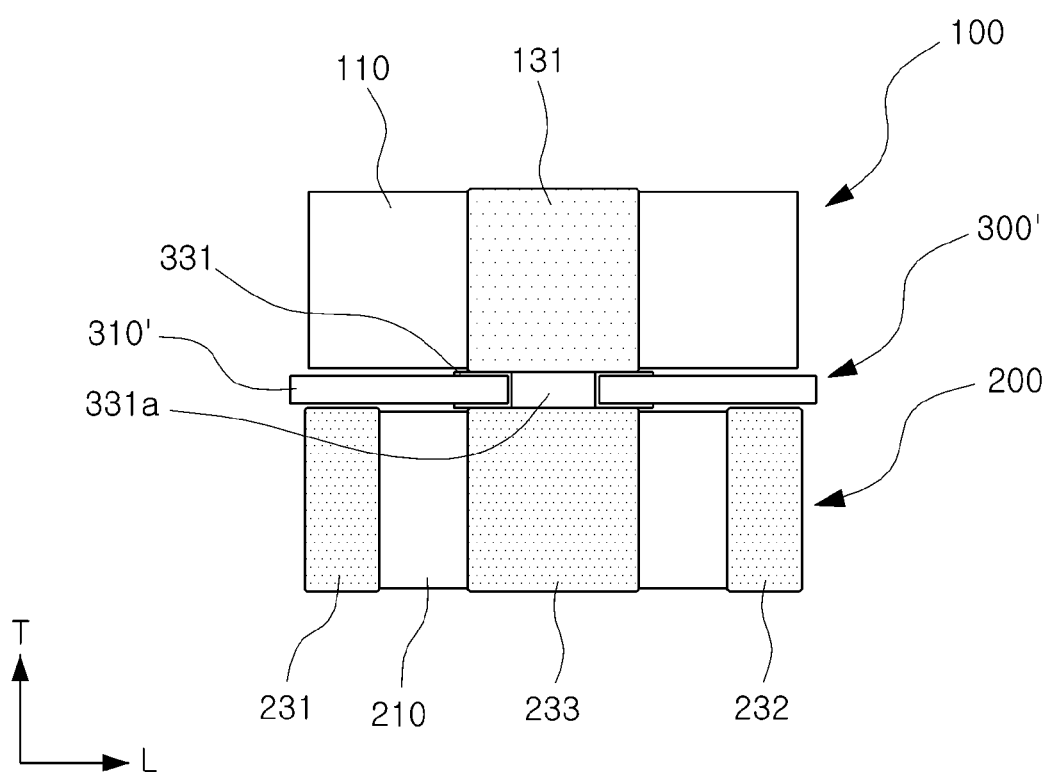
FIG. 6 is a schematic cross-sectional diagram of the composite electronic component according to another exemplary embodiment of the present disclosure.

FIGS. 4 and 5 are a schematic exploded perspective diagram and a perspective diagram of a composite electronic component according to another exemplary embodiment of the present disclosure, respectively, and FIG. 6 is a schematic cross-sectional diagram of the composite electronic component.

A structure of the composite electronic component according to another exemplary embodiment of the present disclosure will be described with reference to FIGS. 4 through 6.

In the composite electronic component according to another exemplary embodiment of the present disclosure, first and second groove portions 331a and 332a formed so that upper and lower portions thereof are open may be formed in both side surfaces of an interposer board 300' in the width direction, unlike the composite electronic component illustrated in FIGS. 1 through 3.

First and second terminal electrodes 331 and 332 may be formed on upper and lower surfaces of the interposer board 300' to face each other.

First and second connection conductors may be formed on the first and second groove portions 331a and 332a.

The first and second connection conductors may be formed by applying a conductive material, but are not limited thereto.

The first connection conductor may serve to vertically electrically connect the first terminal electrodes 331 to each other, and the second connection conductor may serve to vertically electrically connect second terminal electrodes 332 to each other.

That is, first and second external electrodes 131 and 132 of a first electronic component 100 and third and fourth external electrodes 233 and 234 of a second electronic component 200 may be electrically connected to each other by the first and second connection conductors formed on the first and second groove portions 331a and 332a.

Figure 7:
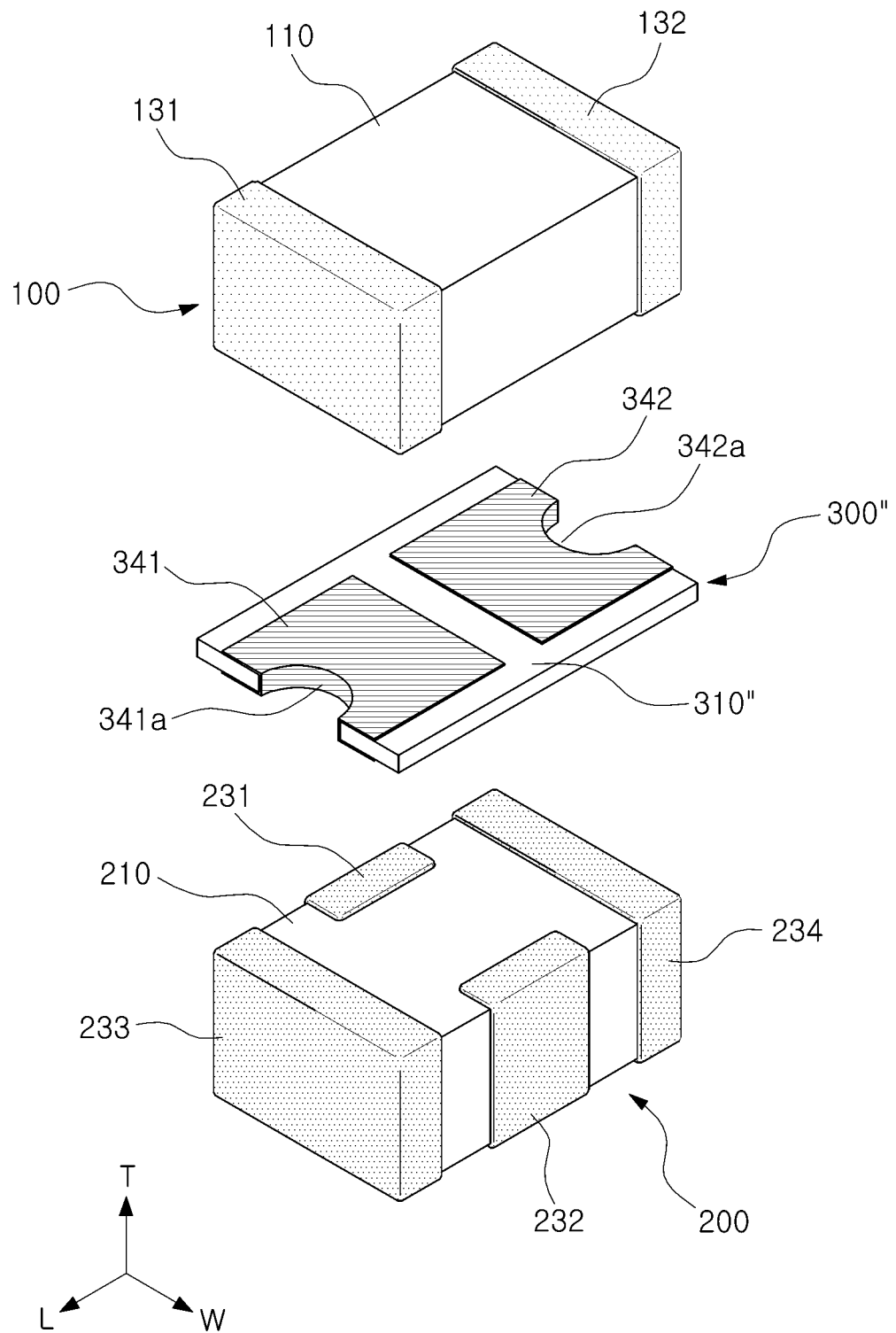
FIG. 7 is a schematic exploded perspective diagram of a composite electronic component according to another exemplary embodiment of the present disclosure.
Figure 8:
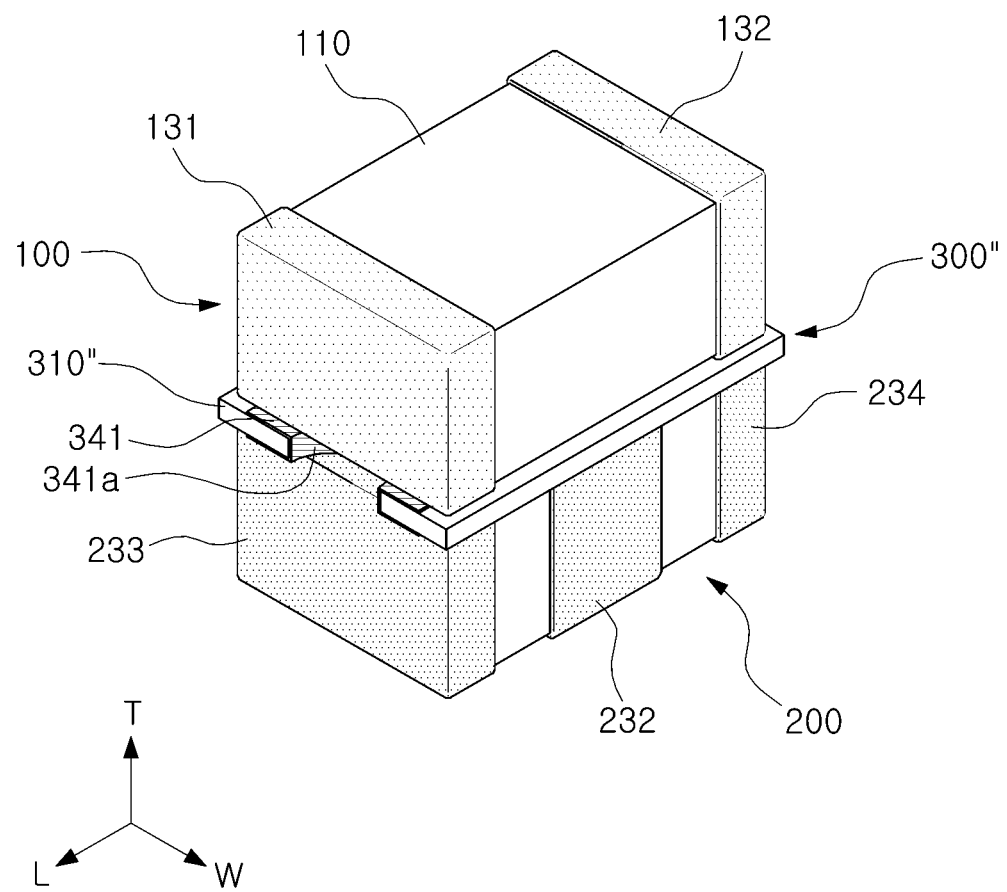
FIG. 8 is a schematic perspective diagram of the composite electronic component according to another exemplary embodiment of the present disclosure.
Figure 9:
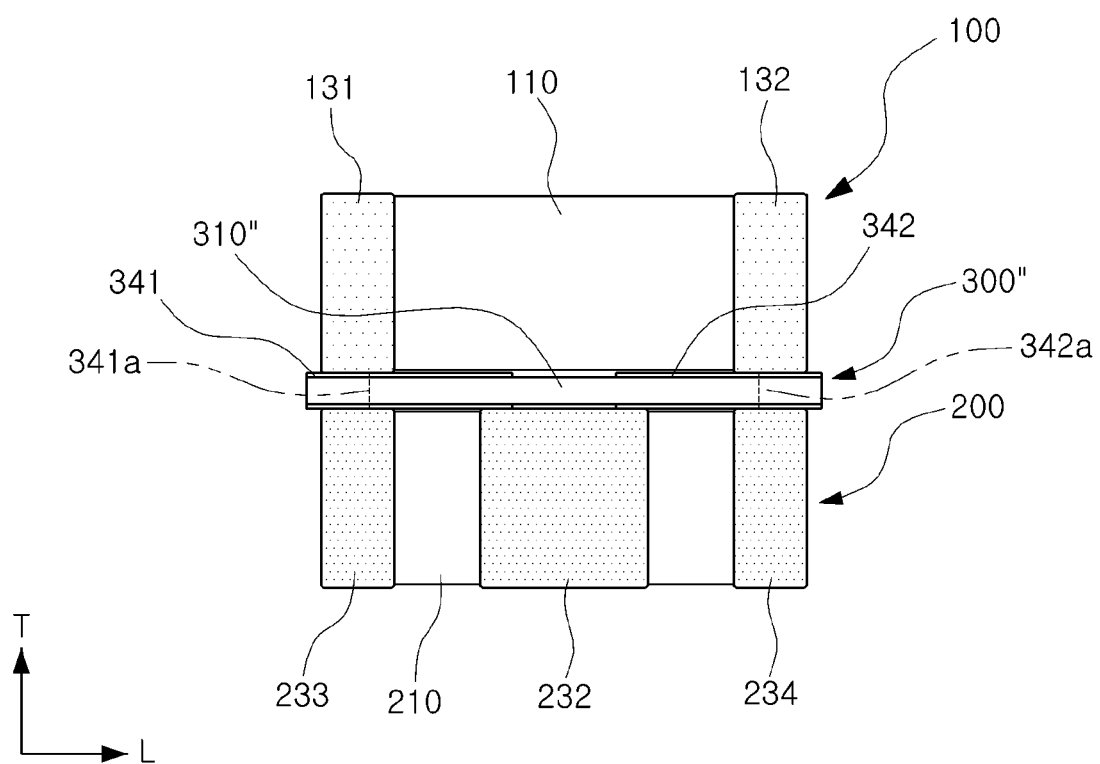
FIG. 9 is a schematic cross-sectional diagram of the composite electronic component according to another exemplary embodiment of the present disclosure.

FIGS. 7 and 8 are a schematic exploded perspective diagram and a perspective diagram of a composite electronic component according to another exemplary embodiment of the present disclosure, respectively, and FIG. 9 is a schematic cross-sectional diagram of the composite electronic component.

A structure of the composite electronic component according to another exemplary embodiment of the present disclosure will be described with reference to FIGS. 7 through 9.

The composite electronic component according to another exemplary embodiment of the present disclosure may include a first electronic component 100, a second electronic component 200, and an interposer board 300".

The first and second electronic components 100 and 200 may be inductors or capacitors.

In the first electronic component 100, first and second external electrodes 131 and 132 may be disposed on end portions of a body 110 in the length (L) direction.

The first and second external electrodes 131 and 132 of the first electronic component 100 may be extended from both end portions of the body 110 in the length direction onto portions of a lower surface of the body 110, respectively.

At least one external electrode may be formed on the first electronic component 100, and as needed, several external electrodes may be formed thereon.

In the case in which the first electronic component 100 is a capacitor, the first and second external electrodes 131 and 132 may be electrically connected to stacked internal electrodes, such that the internal electrodes may alternately have positive and negative polarities.

In the second electronic component 200, third and fourth external electrodes 233 and 234 may be disposed on both end portions of a body 210 in the length (L) direction, and fifth and sixth external electrodes 231 and 232 may be disposed on both side surfaces thereof in the width (W) direction.

The third and fourth external electrodes 233 and 234 of the second electronic component 200 may be extended from both end portions of the body 210 in the length (L) direction onto portions of an upper surface of the body 210, respectively.

In the case in which the second electronic component 200 is an inductor, the fifth and sixth external electrodes 231 and 232 may be electrically connected to coil shaped internal electrodes in the body 210.

The interposer board 300" may be positioned between the first and second electronic components 100 and 200.

That is, the first electronic component 100 may be mounted on an upper surface of the interposer board 200, and the second electronic component 200 may be mounted on a lower surface of the interposer board 300".

An electrical connection part may be formed on the interposer board 300".

The electrical connection part may include a pair of first terminal electrodes 311 and 312 and a pair of second terminal electrodes 313 and 314 that are disposed on the upper and lower surfaces of the interposer board 300" to face each other.

First and second groove portions 341a and 342a formed so that upper and lower portions thereof are open may be formed in both end portions of the interposer board 300" in the length (L) direction.

First and second terminal electrodes 341 and 342 may be formed to face each other on upper and lower surfaces of the interposer board 300".

First and second connection conductors may be formed on the first and second groove portions 341a and 342a, respectively.

The first and second connection conductors may be formed by applying a conductive material, but are not limited thereto.

The first connection conductors may serve to vertically electrically connect the first terminal electrodes 331 to each other, and the second connection conductor may serve to vertically electrically connect second terminal electrodes 341 and 342 to each other.

That is, the first and second external electrodes 131 and 132 of the first electronic component 100 and the third and fourth external electrodes 233 and 234 of the second electronic component 200 may be electrically connected to each other by the first and second connection conductors formed on the first and second groove portions 341a and 342a.

Although the case of using groove portions is illustrated in FIGS. 7 through 9, via electrodes may be used similarly to the composite electronic component illustrated in FIGS. 1 through 3.

Figure 10:
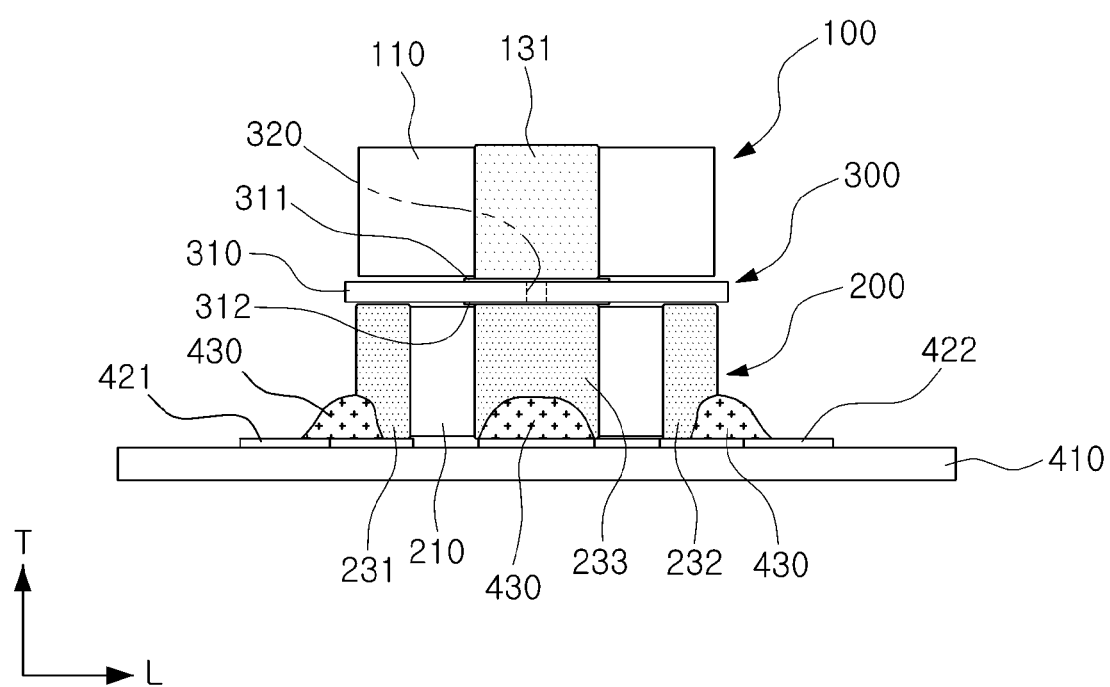
FIG. 10 is a schematic cross-sectional diagram of aboard having a composite electronic component according to an exemplary embodiment of the present disclosure.
Figure 11:
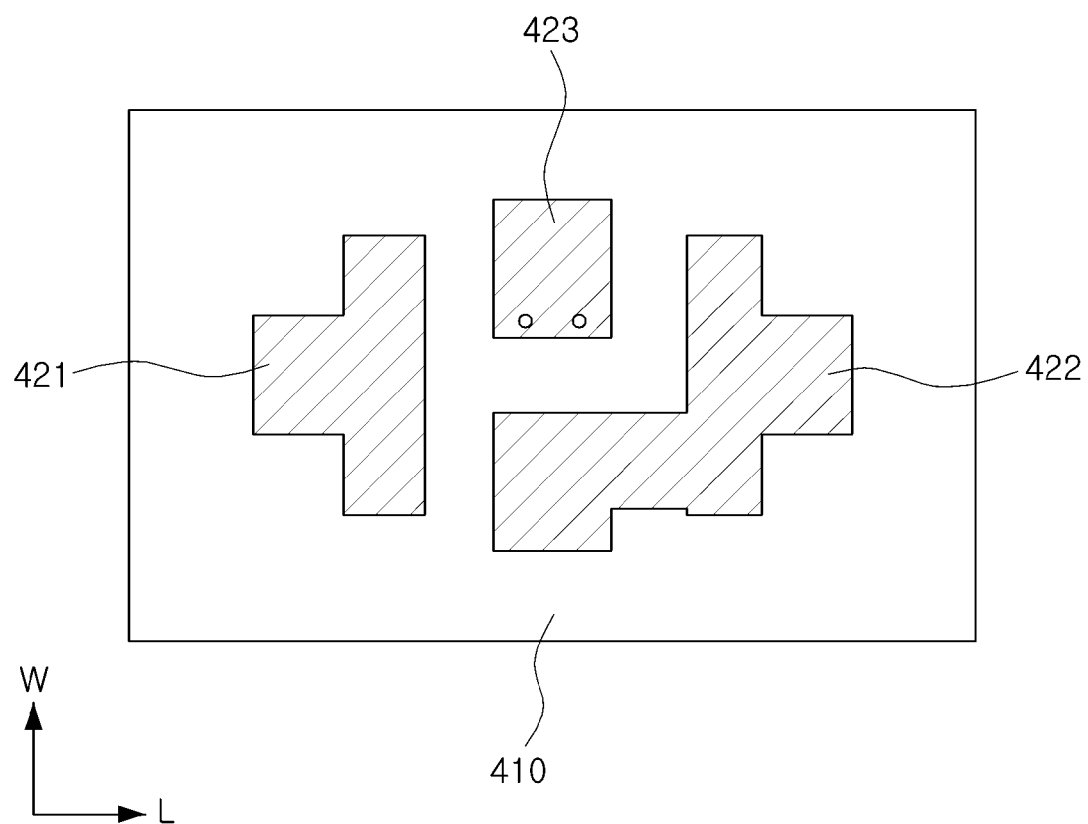
FIG. 11 is a schematic plan diagram showing a land pattern of the circuit board having a composite electronic component.

FIG. 10 is a schematic cross-sectional diagram of a board having a composite electronic component according to an exemplary embodiment of the present disclosure, and FIG. 11 is a schematic plan diagram showing a land pattern of the board having a composite electronic component.

A structure of a board having a composite electronic component will be described with reference to FIGS. 10 and 11. The board having a composite electronic component may include a circuit board 410 on which land patterns 421, 422, and 423 are formed; and the composite electronic component mounted on the land patterns 421, 422, and 423, wherein the composite electronic component includes an interposer board 300; and first and second electronic components 100 and 200 mounted on upper and lower surfaces of the interposer board 300, respectively, the first and second electronic components 100 and 200 being connected to each other by an electrical connection part provided on the interposer board 300.

The land patterns 421, 422, and 423 may be disposed in a sequence of a first land pattern 421, a second land pattern 422, and a third land pattern 423 in a counterclockwise direction.

The composite electronic component may be adhered to the circuit board 410 by a conductive adhesive.

The composite electronic component may be adhered to the land patterns 421, 422, and 423 of a printed circuit board 410 using solder 430.

In a 1005-size electronic component, in the case in which an external electrode is disposed on a side surface of a body thereof in a width direction, acoustic noise is about 34 dB.

In the 1005-size electronic component, in the case in which an external electrode is disposed on an end surface of a body thereof in the length direction, acoustic noise is about 22 dB.

However, as a result of mounting the composite electronic component according to an exemplary embodiment of the present disclosure illustrated in FIGS. 1 through 3 on a printed circuit board 410 and measuring acoustic noise, it may be appreciated that acoustic noise was decreased to 17 dB.

In addition as a result of mounting the composite electronic component according to another exemplary embodiment of the present disclosure illustrated in FIGS. 7 through 9 on a printed circuit board 410 and measuring acoustic noise, it may be appreciated that acoustic noise was decreased to 23 dB.

The reason may be that vibration of the printed circuit board is decreased by offsetting stress of the electronic component using the interposer board 300, and accordingly, acoustic noise is decreased.

In the case of mounting the composite electronic components illustrated in FIGS. 1 through 6 on the circuit board 410, the fifth external electrode 231 and the first land pattern 421 may be connected to each other, the third and sixth external electrodes 233 and 232 may be connected to the second land pattern 422, and the fourth external electrode 234 may be connected to the third land pattern 423.

Further, in the case of mounting the composite electronic component illustrated in FIGS. 7 through 9 on the circuit board 410, the third external electrode 233 and the first land pattern 421 may be connected to each other, the fourth and sixth external electrodes 234 and 232 may be connected to the second land pattern 422, and the fifth external electrode 231 may be connected to the third land pattern 423.

Figure 12:
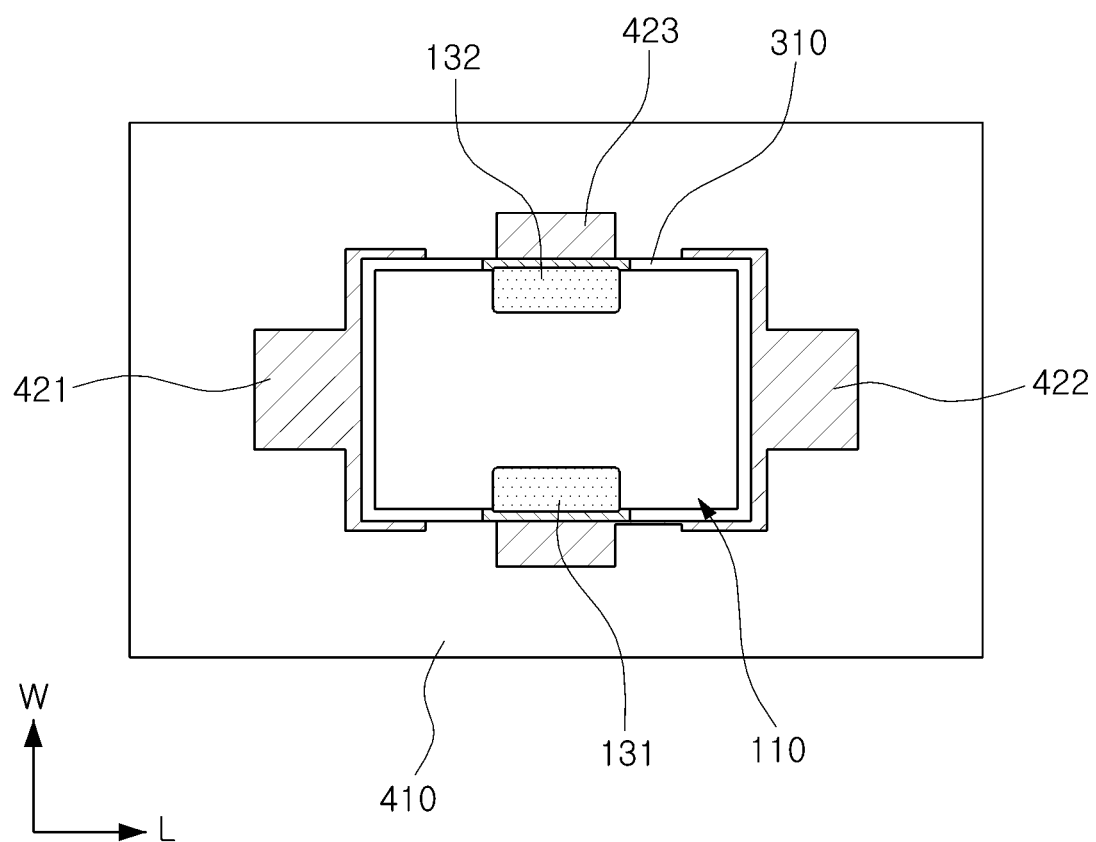
FIG. 12 is a schematic plan diagram of the board having a composite electronic component according to an exemplary embodiment of the present disclosure.

FIG. 12 is a schematic plan diagram of the board having a composite electronic component according to an exemplary embodiment of the present disclosure.

Referring to FIG. 12, since a plurality of electronic components 100 and 200 may be stacked in an area in which a single electronic component may be mounted in the height (T) direction, a mounting area may be significantly decreased.

Further, in the case of mounting the composite electronic component on a printed circuit board 410, a mounting process may be configured of a single step, such that a cost may be decreased due to a decrease in the number of process.

In addition, a loss due to a wiring may be decreased by significantly decreasing an interval between the electronic components 100 and 200 configuring the composite electronic component using the interposer board 300.

Figure 13:
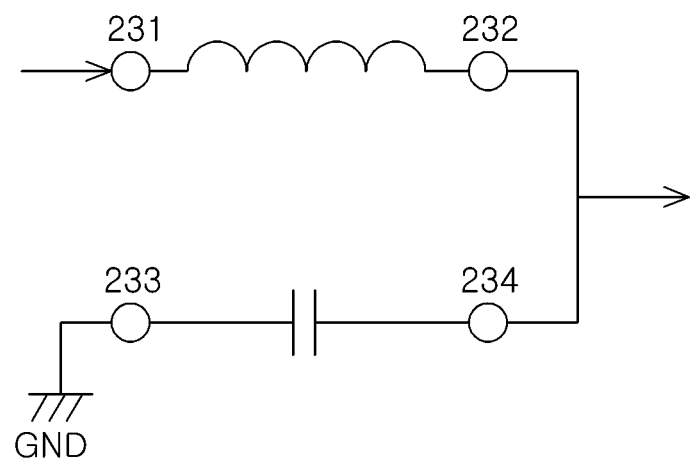
FIG. 13 is a schematic circuit diagram of the composite electronic component according to an exemplary embodiment of the present disclosure.

FIG. 13 is a schematic circuit diagram of the composite electronic component according to an exemplary embodiment of the present disclosure.

As illustrated in FIG. 13, in the case in which the first electronic component is a capacitor and the second electronic component is an inductor, the composite electronic component may operate as a LC filter.

In this case, the third and fourth external electrodes 233 and 234 are connected to the capacitor, and the fifth and sixth external electrodes 231 and 232 are connected to the inductor, such that the composite electronic component may act as the LC filter.

If necessary, the first electronic component 100 may operate as an inductor and the second electronic component 200 may operate as a capacitor.

As set forth above, according to exemplary embodiments of the present disclosure, the mounting area may be decreased by stacking the plurality of electronic components in amounting area of a single electronic component using the interposer board.

Vibration of the board having a composite electronic component may be decreased by offsetting stress of the electronic component using the interposer board.

In addition, the loss due to the wiring may be decreased by significantly decreasing the interval between the electronic components configuring the composite electronic component using the interposer board.

While exemplary embodiments have been shown and described above, it will be apparent to those skilled in the art that modifications and variations could be made without departing from the scope of the present invention as defined by the appended claims.

What is claimed is:

1. A composite electronic component comprising:
an interposer board; and
first and second electronic components mounted on upper and lower surfaces of the interposer board, respectively,
wherein the first and second electronic components are electrically connected to each other by an electrical connection part provided on the interposer board,
wherein the electrical connection part includes:
a pair of first terminal electrodes disposed on the upper surface of the interposer board; and
a pair of second terminal electrodes disposed on the lower surface of the interposer board to face the pair of first terminal electrodes, respectively, and
wherein the pair of first terminal electrodes and the pair of second terminal electrodes are electrically connected to each other.

2. The composite electronic component of claim 1, wherein the electrical connection part further includes:
first and second via electrodes formed in the interposer board in a thickness direction of the interposer board to connect the pair of first terminal electrodes to each other and the pair of second terminal electrodes to each other, respectively.

3. The composite electronic component of claim 2, wherein the first and second terminal electrodes are disposed to be adjacent to both side surfaces of the interposer board in a width direction of the interposer board, respectively,
the first electronic component includes first and second external electrodes extended from both side surfaces of the first electronic component in the width direction onto portions of a lower surface of the interposer so as to be connected to the first and second terminal electrodes, respectively, and
the second electronic component includes third and fourth external electrodes extended from both side surfaces of the second electronic component in the width direction onto portions of an upper surface of the second electronic component so as to be connected to the first and second terminal electrodes, respectively; and
fifth and sixth external electrodes disposed on both end portions of the second electronic component in a length direction of the second electronic component.

4. The composite electronic component of claim 1, wherein the electrical connection part further includes:
first and second groove portions formed in both side surfaces of the interposer board in the length direction so that upper and lower portions of the first and second groove portions are open; and
first and second connection conductors disposed on the first and second groove portions,
wherein the pair of first terminal electrodes being connected to each other by the first connection conductor and the pair of second terminal electrodes being connected to each other by the second connection conductor.

5. The composite electronic component of claim 4, wherein the first electronic component includes first and second external electrodes extended from both side surfaces of the first electronic component in the width direction onto portions of a lower surface of the first electronic component so as to be connected to the first and second terminal electrodes, respectively, and
the second electronic component includes third and fourth external electrodes extended from both side surfaces of the second electronic component in the width direction onto portions of an upper surface of the second electronic component so as to be connected to the first and second terminal electrodes, respectively; and
fifth and sixth external electrodes disposed on both end portions of the second electronic component in the length direction.

6. The composite electronic component of claim 1, wherein the electrical connection part further includes:
first and second groove portions formed in both end portions of the interposer board in the length direction so that upper and lower portions of the first and second groove portions are open; and first and second connection conductors disposed on the first and second groove portions,
wherein the pair of first terminal electrodes being connected to each other by the first connection conductor and the pair of second terminal electrodes being connected to each other by the second connection conductor.

7. The composite electronic component of claim 6, wherein the first electronic component includes first and second external electrodes extended from both end portions of the first electronic component in the length direction onto portions of a lower surface of the first electronic component so as to be connected to the first and second terminal electrodes, respectively, and
the second electronic component includes third and fourth external electrodes extended from both end surfaces of the second electronic component in the length direction onto portions of an upper surface of the second electronic component so as to be connected to the first and second terminal electrodes, respectively, and fifth and sixth external electrodes disposed on both side surfaces of the second electronic component in the width direction, respectively.

8. The composite electronic component of claim 1, wherein the first and second electronic components are connected to the electrical connection part by a conductive adhesive.

9. The composite electronic component of claim 1, wherein the first electronic component is an inductor, and the second electronic component is a capacitor.

10. The composite electronic component of claim 1, wherein the first electronic component is a capacitor, and the second electronic component is an inductor.

11. A board having a composite electronic component, the board comprising:
a circuit board on which a land pattern are formed; and
the composite electronic component mounted on the land pattern,
wherein the composite electronic component includes:
an interposer board; and
first and second electronic components mounted on upper and lower surfaces of the interposer board, respectively,
the first and second electronic components being electrically connected to each other by an electrical connection part provided on the interposer board,
wherein the electrical connection part includes:
a pair of first terminal electrodes disposed on the upper surface of the interposer board; and
a pair of second terminal electrodes disposed on the lower surface of the interposer board to face the pair of first terminal electrodes, respectively, and
wherein the pair of first terminal electrodes and the pair of second terminal electrodes are electrically connected to each other.

12. The board of claim 11, wherein in the composite electronic component, the electrical connection part further includes:
first and second via electrodes formed in the interposer board in a thickness direction of the interposer board to connect the pair of first terminal electrodes to each other and the pair of second terminal electrodes to each other, respectively.

13. The board of claim 12, wherein in the composite electronic component, the first and second terminal electrodes are disposed to be adjacent to both side surfaces of the interposer board in a width direction of the interposer board, respectively; the first electronic component includes first and second external electrodes extended from both side surfaces of the first electronic component in the width direction onto portions of a lower surface of the first electronic component so as to be connected to the first and second terminal electrodes, respectively; and the second electronic component includes third and fourth external electrodes extended from both side surfaces of the second electronic component in the width direction onto portions of an upper surface of the second electronic component so as to be connected to the first and second terminal electrodes, respectively, and fifth and sixth external electrodes disposed on both end portions of the second electronic component in a length direction of the second electronic component.

14. The board of claim 13, wherein the land pattern of the circuit board includes:
a first land pattern connected to the fifth external electrode of the second electronic component;
a second land pattern simultaneously connected to the third and sixth external electrodes of the second electronic component; and
a third land pattern connected to the fourth external electrode of the second electronic component.

15. The board of claim 11, wherein in the composite electronic component, the electrical connection part further includes:
first and second groove portions formed in both side surfaces of the interposer board in the width direction so that upper and lower portions of the first and second groove portions are open; and
first and second connection conductors disposed on the first and second groove portions,
wherein the pair of first terminal electrodes being connected to each other by the first connection conductor and the pair of second terminal electrodes being connected to each other by the second connection conductor.

16. The board of claim 15, wherein in the composite electronic component, the first electronic component includes first and second external electrodes extended from both side surfaces of the first electronic component in the width direction onto portions of a lower surface of the first electronic component so as to be connected to the first and second terminal electrodes, respectively, and the second electronic component includes third and fourth external electrodes extended from both side surfaces of the second electronic component in the width direction onto portions of an upper surface of the second electronic component so as to be connected to the first and second terminal electrodes, respectively, and fifth and sixth external electrodes disposed on both end portions of the second electronic component in the length direction.

17. The board of claim 16, wherein the land pattern of the circuit board includes:
a first land pattern connected to the fifth external electrode of the second electronic component;
a second land pattern simultaneously connected to the third and sixth external electrodes of the second electronic component; and
a third land pattern connected to the fourth external electrode of the second electronic component.

18. The board of claim 11, wherein in the composite electronic component, the electrical connection part further includes: first and second groove portions formed in both end portions of the interposer board in the length direction so that upper and lower portions of the first and second groove portions are open; and first and second connection conductors disposed on the first and second groove portions, wherein the pair of first terminal electrodes being connected to each other by the first connection conductor and the pair of second terminal electrodes being connected to each other by the second connection conductor.

19. The board of claim 18, wherein in the composite electronic component, the first electronic component includes first and second external electrodes extended from both end portions of the first electronic component in the length direction onto portions of a lower surface of the first electronic component so as to be connected to the first and second terminal electrodes, respectively, and the second electronic component includes third and fourth external electrodes extended from both end portions of the second electronic component in the length direction onto portions of an upper surface of the second electronic component so as to be connected to the first and second terminal electrodes, respectively; and fifth and sixth external electrodes disposed on both side surfaces of the second electronic component in the width direction.

20. The board of claim 19, wherein the land pattern of the circuit board includes:
- a first land pattern connected to the third external electrode of the second electronic component;
- a second land pattern simultaneously connected to the fourth and sixth external electrodes of the second electronic component; and
- a third land pattern connected to the fifth external electrode of the second electronic component.

* * * * *